(12) United States Patent
Choi et al.

(10) Patent No.: US 7,125,758 B2
(45) Date of Patent: Oct. 24, 2006

(54) CONTROLLING THE PROPERTIES AND UNIFORMITY OF A SILICON NITRIDE FILM BY CONTROLLING THE FILM FORMING PRECURSORS

(75) Inventors: Soo Young Choi, Fremont, CA (US);
Tae Kyung Won, San Jose, CA (US);
Gaku Furuta, Sunnyvale, CA (US);
Qunhua Wang, San Jose, CA (US);
John M. White, Hayward, CA (US);
Beom Soo Park, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 154 days.

(21) Appl. No.: 10/829,016

(22) Filed: Apr. 20, 2004

(65) Prior Publication Data

US 2005/0233595 A1    Oct. 20, 2005

(51) Int. Cl.
*H01L 21/471* (2006.01)
(52) U.S. Cl. ..................... 438/151; 438/792
(58) Field of Classification Search ............. 438/792
See application file for complete search history.

(56) References Cited

U.S. PATENT DOCUMENTS

| | | | |
|---|---|---|---|
| 4,563,367 A * | 1/1986 | Sherman | 427/563 |
| 5,399,387 A | 3/1995 | Law et al. | 427/574 |
| 5,714,408 A * | 2/1998 | Ichikawa et al. | 438/761 |
| 5,928,732 A | 7/1999 | Law et al. | 427/579 |
| 6,040,022 A | 3/2000 | Chang et al. | 427/579 |
| 6,140,255 A * | 10/2000 | Ngo et al. | 438/791 |
| 6,150,283 A | 11/2000 | Ishiguro et al. | 438/758 |
| 6,232,218 B1 * | 5/2001 | Cathey et al. | 438/634 |
| 6,338,874 B1 | 1/2002 | Law et al. | 427/255.18 |
| 6,566,186 B1 * | 5/2003 | Allman et al. | 438/239 |
| 6,756,324 B1 * | 6/2004 | Gates | 438/791 |
| 6,924,241 B1 * | 8/2005 | Lee | 438/792 |
| 2002/0006478 A1 | 1/2002 | Yuda et al. | 118/715 |
| 2002/0146879 A1 | 10/2002 | Fu et al. | 438/230 |
| 2002/0189545 A1 | 12/2002 | Matsumura et al. | 219/390 |
| 2003/0199175 A1 | 10/2003 | Tang et al. | 438/791 |
| 2004/0043637 A1 | 3/2004 | Aota et al. | 438/791 |

FOREIGN PATENT DOCUMENTS

EP    1168427    1/2002

OTHER PUBLICATIONS

S. K. Kim et al., "A Novel Self-Aligned Coplanar Amorphous Silicon Thin Film Transistor", ISSN0098-0966X/98/2901 (1998).

(Continued)

*Primary Examiner*—Stephen W. Smoot
(74) *Attorney, Agent, or Firm*—Shirley L. Church

(57) ABSTRACT

We have developed a method of PECVD depositing a-SiN$_x$:H films which are useful in a TFT device as gate dielectric and passivation layers, when a series of TFT devices are arrayed over a substrate having a surface area larger than about 1 m$^2$, which may be in the range of about 4.1 m$^2$, and even as large as 9 m$^2$. The a-SiN$_x$:H films provide a uniformity of film thickness and uniformity of film properties, including chemical composition, which are necessary over such large substrate surface areas. The films produced by the method are useful for both liquid crystal active matrix displays and for organic light emitting diode control.

23 Claims, 5 Drawing Sheets

OTHER PUBLICATIONS

L. Kyung-ha, "A Study on Laser Annealed Polycrystalline Silicon Thin Film Transistors (TFTs) with SiNx Gate Insulator", Kyung Hee University, Ch. 2 & 4 (1998).

Y. Park, "Bulk and interface properties of low-temperature silicon nitride films deposited by remote plasma enhanced chemical vapor deposition", Journal of Materials Science: Materials in Electronics, vol. 12, pp. 515-522 (2001).

A. Sazonov et al., "Low Temperature a-Si:H TFT on Plastic Films: Materials and Fabrication Aspects", Proc. 23$^{rd}$ International Conference on Microelectronics (MIEL 2002), vol. 2, Niš, Yugoslavia (May 2002).

D. B. Thomasson et al., "High Mobility Tri-Layer a-Si:H Thin Film Transistors with Ultra-Thin Active Layer", 1997 Society for Information Display International Symposium Digest of Technical Papers, vol. 28, pp. 176-179 (May 1997).

Yue Kuo, "Plasma Enhanced Chemical Vapor Deposited Silicon Nitride as a Gate Dielectric Film for Amorphous Silicon Thin Film Transistors—A Critical Review", *Vacuum*, vol. 51, No. 4, pp. 741-745, Elsevier Science, Ltd., Pergamon Press, Great Britain, Dec. 1998.

International Search Report of corresponding PCT Application No. PCT/US2005/012832, mailed Aug. 11, 2005.

\* cited by examiner

300 {
ITO Pattern(MASK5)
ITO Sputtering
Passivation Etch(MASK4)
SiNx PECVD
n+ a-Si Etch-Back
S/D Pattern(MASK3)
S/D Sputtering
a-Si Pattern(MASK2)
n+a-Si/a-Si/SiNx PECVD
Gate Pattern(MASK1)
Gate Metal Sputtering

CONTROLLING THE PROPERTIES AND UNIFORMITY OF A SILICON NITRIDE FILM BY CONTROLLING THE FILM FORMING PRECURSORS

BACKGROUND OF THE INVENTION

1. Field of the Invention

The present invention pertains to a method of controlling the properties and uniformity of a silicon nitride film deposited by CVD (chemical vapor deposition) over a large surface area, and to the film produced by the method. In particular, the ion mobility and/or resistivity of the silicon nitride film are controlled within particular ranges.

2. Brief Description of the Background Art

Current interest in thin film transistor (TFT) arrays is particularly high because these devices are used in liquid crystal active matrix displays of the kind often employed for computer and television flat panels. The liquid crystal active matrix displays may also contain light emitting diodes for back lighting. Further, organic light emitting diodes (OLEDs) have been used for active matrix displays, and these organic light emitting diodes require TFTs for addressing the activity of the displays.

The TFT arrays are typically created on a flat substrate. The substrate may be a semiconductor substrate, or may be a transparent substrate such as a glass, quartz, sapphire, or a clear plastic film. The TFT which is the subject of the present invention employs silicon-containing films, and in particular employs silicon nitride containing films for dielectric layers. A first silicon nitride-comprising film is referred to as the gate dielectric because it overlies the conductive gate electrode. A second silicon nitride-comprising film is referred to as the passivation dielectric and overlies the upper surface of a second conductive electrode, to electrically isolate the second conductive electrode from the ambient surrounding the upper surface of the TFT device (where the lower surface of the TFT device is the glass, quartz, sapphire, plastic, or semiconductor substrate).

FIG. 1 illustrates a schematic cross-sectional view of a thin film transistor structure of the kind which may employ both a silicon nitride-comprising gate dielectric film and a silicon nitride-comprising passivation dielectric film. This kind of thin film transistor is frequently referred to as an inverse staggered α-Si TFT with a $SiN_x$ layer as a gate insulator or as a back channel etch (BCE) inverted staggered (bottom gate) TFT structure. This structure is one of the more preferred TFT structures because the gate dielectric ($SiN_x$) and the intrinsic as well as n+ (or p+) doped amorphous silicon films can be deposited in a single PECVD pump-down run. The BCE TFT shown in FIG. 1 involves only 4 or 5 patterning masks.

As previously mentioned, the substrate 101 typically comprises a material that is essentially optically transparent in the visible spectrum, such as glass, quartz, sapphire, or a clear plastic. The substrate may be of varying shapes or dimensions. Typically, for TFT applications, the substrate is a glass substrate with a surface area greater than about 500 mm². A gate electrode layer 102 is formed on the substrate 101. The gate electrode layer 102 may comprise a metal layer such as, for example, aluminum (Al), tungsten (W), chromium (Cr), tantalum (Ta), molybdenum (Mo), molybdenum tungsten (MoW), titanium (Ti), or combinations thereof, among others. The gate electrode layer 102 may be formed using conventional deposition, lithography and etching techniques. Between the substrate 101 and the gate electrode layer 102, there may be an optional (not shown) insulating layer, for example, such a silicon oxide, or silicon nitride, which may also be formed using a PECVD system of the kind which will be described later herein.

A gate dielectric layer 103 is formed on the gate electrode layer 102. The gate dielectric layer may be silicon oxide, silicon oxynitride, or silicon nitride, deposited using such a PECVD system. The gate dielectric layer 103 may be formed to a thickness in the range of about 100 Å to about 6,000 Å.

A bulk semiconductor layer 104 is formed on the gate dielectric layer 103. The bulk semiconductor layer 104 may comprise polycrystalline silicon (polysilicon), microcrystalline silicon (μc-Si), or amorphous silicon (α-silicon), which films can also be deposited using a PECVD system, or other conventional methods known in the art. Bulk semiconductor layer 104 may be deposited to a thickness in the range of about 100 Å to about 3,000 Å. A doped semiconductor layer 105 is formed on top of the semiconductor layer 104. The doped semiconductor layer 105 may comprise n-type (n+) or p-type (p+) doped polycyrstalline, microcrystalline, or amorphous silicon. Doped semiconductor layer 105 may be deposited to a thickness within a range of about 100 Å to about 3,000 Å. An example of the doped semiconductor layer 105 is n+ doped α-silicon film. The bulk semiconductor layer 104 and the doped semiconductor layer 105 are lithographically patterned and etched using conventional techniques to define a mesa of these two films over the gate dielectric insulator, which also serves as storage capacitor dielectric. The doped semiconductor layer 105 directly contacts portions of the bulk semiconductor layer 104, forming a semiconductor junction.

A conductive layer 106 is then deposited on the exposed surfaces of gate dielectric layer 103, semiconductor layer 104, and doped semiconductor layer 105. The conductive layer 106 may comprise a metal such as, for example, aluminum, tungsten, molybdenum, chromium, tantalum, and combinations thereof, among others. The conductive layer 106 may be formed using conventional deposition techniques. Both the conductive layer 106 and doped semiconductor layer 105 may be lithographically patterned to define source and drain contacts of the TFT, 106a and 106b, respectively in FIG. 1. After formation of the source and drain contacts 106a and 106b, a passivation dielectric layer 107 is typically applied. The passivation dielectric layer may be, for example, a silicon oxide or a silicon nitride. The passivation layer 107 may be formed using, for example, PECVD or other conventional methods known in the art. The passivation layer 107 may be deposited to a thickness in the range of about 1,000 Å to about 5,000 Å. The passivation layer 107 is then lithographically patterned and etched using conventional techniques, to open contact holes in the passivation layer.

A transparent electrically conductive layer 108 is then deposited and patterned to make contacts with the conductive layer 106. The transparent conductor layer 108 comprises a material that is essentially optically transparent in the visible spectrum. Transparent conductor 108 may comprise, for example, indium tin oxide (ITO) or zinc oxide among others. Patterning of the transparent electrically conductive layer 108 is accomplished by conventional lithographic and etching methods.

There are a number of additional TFT structures which can employ silicon nitride gate insulators, and several of these are presented in a disclosure entitled "A Study on Laser Annealed Polycrystalline Silicon Thin Film Transistors (TFTs) with SiNx Gate Insulator", by Dr. Lee Kyung-ha (Kyung Hee University, 1998). This disclosure is available at http://tftcd.khu.ac.kr/research/polySi. Dr. Lee Kyung-ha's disclosure pertains mainly to the use of laser annealed poly-Si TFTs, which is not the subject matter of the present invention, but the TFT structures are of interest as background material. The structures of interest are presented in Chapter 2 of the disclosure.

D.B. Thomasson et al., in an article entitled: "High Mobility Tri-Layer a-Si:H Thin Film Transistors with Ultra-Thin Active Layer", 1997 Society for Information Display International Symposium Digest of Technical Papers, volume 28, pages 176–179, describe active matrix liquid crystal displays where the TFT has an active layer thickness of about 13 nm. The TFT structure is a glass substrate with a molybdenum bottom electrode, a silicon nitride gate dielectric layer, an a-Si:H layer overlying the silicon nitride gate dielectric layer, n+μc-Si: H doped source and drain regions, separated by a silicon nitride dielectric mesa, and with an aluminum contact layer overlying each source and drain region. This is referred to as a Tri-layer a-Si:H TFT structure. The authors claim that such hydrogenated amorphous silicon thin-film transistors with active layer thickness of 13 nm perform better for display applications than devices with thicker (50 nm) active layers. The linear ($V_{DS}$=0.1V) and saturation region mobility of a 5 μm channel length device is said to increase from 0.4 cm$^2$/V·sec and 0.7 cm$^2$/V·sec for a 50 nm a-Si:H device to 0.7cm$^2$/V·sec and 1.2 cm$^2$/V·sec for a 13 nm a-Si:H layer device fabricated with otherwise identical geometry and processing. The gate dielectric silicon nitride was deposited from a reactant gas mixture of SiH$_4$, NH$_3$, and AR at 100 mW/cm$^2$, −150V, 0.5torr and 300° C. The passivation silicon nitride dielectric layer was deposited at the same conditions as the gate dielectric, with the exception of substrate temperature, which was 250° C.

Young-Bae Park et al., in an article entitled: "Bulk and interface properties of low-temperature silicon nitride films deposited by remote plasma enhanced chemical vapor deposition", Journal of Materials Science: Materials in Electronics 23 (2001) 515–522, describe problems which occur when a gate dielectric, rather than being SiN$_x$ is a hydrogenated silicon nitride film (a-SiN$_x$:H). PECVD a-SiN$_x$:H thin films are said to be widely used as a gate dielectric for a-Si:H TFT applications, due to the good interfacial property between an a-Si:H layer and an a-Si:N$_x$:H layer. However, the a-Si:H TFTs with SiN$_x$:H gate dielectric is said to have instability problems such as the threshold voltage shift and the inverse subthreshold slope under a D.C. gate voltage bias. Their instability problems are said to be caused by the high trap density in the SiN$_x$:H film and the defects created at the a-Si:H/SiN$_x$:H interface. Charge trapping in the SiN$_x$:H is said to be from the electron injection under an applied field and due to the localized states of the Si dangling bonds, Si—H and N—H bonds in the forbidden gap. The authors claim that PECVD SiN$_x$:H dielectric films are not useful as a gate insulator because they contain large amounts of bonded hydrogen (20%–40%) in the form of N—H and Si—H bonds.

The authors propose that a remote plasma enhanced chemical vapor deposition of the gate dielectric layer be carried out. The NH$_3$ precursor is excited in a remote plasma zone (at the top of the chamber) to produce NH* or NH$_2$*+H*, after which the activated species* from the plasma zone react with SiH$_4$ introduced downstream through a gas dispersal ring to form the SiNx:H electrical insulator with a reduction in the amounts of bonded hydrogen in the form of Si—H bonds, which are said to easily lose hydrogen to form a dangling bond of the kind known to reduce performance of the TFT device over time.

A presentation entitled: "Low Temperature a-Si:H TFT on Plastic Films: Materials and Fabrication Aspects", by Andrei Sazonov et al., Proc. 23rd International Conference on Microelectronics (MIEL 2002), Vol. 2, NIS, Yugoslavia, 12–15 May 2002, related to fabrication technology for a-SiH thin film transistors at 120° C. for active matrix OLED displays on flexible plastic substrates. The TFTs produced were said to demonstrate performance very close to those fabricated at 260° C. The authors claim that with the proper pixel integration, amorphous hydrogenated silicon (a-Si:H) TFTs are capable of supplying sufficiently high current to achieve required display brightness and thus can be a cost-effective solution for active matrix OLED displays.

The silicon nitride films used to produce the fabricated TFT samples were amorphous silicon nitride deposited at 120° C. by PECVD from SiH$_4$ and NH$_3$ gaseous precursors. The film is said to have a lower mass density and higher hydrogen concentration in comparison with films fabricated at 260° C. to 320° C. In the study, a series of a-SiN$_x$:H films with [N]/[Si] ratio ranging from 1.4 to 1.7 were deposited (at the 120° C.). The hydrogen content in the films was in the range of 25–40 atomic percent. Generally, the films with higher [N]/[Si] are said to have higher mass density and higher compressive stress. The resistivity of a-SiN$_x$:H films estimated at the field of 1 MV/cm was said to be in the range of $10^{14}$–$10^{16}$ Ohm·cm, and the films with higher [N]/[Si] were said to have a higher breakdown field and dielectric constant that their lower N-content counterparts. A table of data supporting these conclusions is presented.

Compared to higher temperature counterparts, the lower temperature a-SiN$_x$ films are characterized by higher hydrogen content. The N-rich films with a hydrogen concentration of about 40% or more exhibit hydrogen bonded predominantly to N atoms, with a high [N]/[Si] ratio achieved solely due to the high concentration of N—H bonds. The TFTs produced an a plastic film substrate at lower temperatures require a higher threshold voltage (4–5V) than the TFTs produced on glass at the higher temperatures. As a result, the ON current observed for TFTs produced at the lower temperatures is lower. Although the performance properties of these TFTs complies with the requirements for OLED applications, it is apparent that it would be beneficial to lower the threshold voltage of the TFTs produced at the 120° C. temperature.

As indicated above, the performance capabilities of the TFT are a direct result of the structural characteristics of the films formed during fabrication of the TFTs. The structural characteristics of the films depend directly upon the process conditions and relative amounts of precursors which are used during formation of the films which make up the TFTs. As the size of flat panel displays increase, it becomes increasingly difficult to control the uniformity of the individual films produced across the increased surface area. With respect to PECVD deposited silicon-nitride comprising films, which are used either as the gate dielectric layer or as the passivation dielectric layer, control of uniformity of the film across the substrate becomes particularly difficult when the PECVD is carried out in a process chamber having parallel-plate capacitively-coupled electrodes over about one meter by one meter. At the higher RF power applications, the RF power appears to concentrate at the center of the electrode area, resulting in a dome-shaped thickness profile, and film properties are indicative of the non-uniform power distribution across the electrodes. This kind of phenomena is more pronounced at the higher RF power which is used to obtain film deposition rates (D/R) which are in excess of about 1000 Å/min.

Conventional PECVD processes for producing a-SiN$_x$:H employ a precursor gas mixture which is highly diluted with nitrogen (N$_2$) to obtain desired film properties. Such desired film properties are: a compressive film stress in the range of about 0 to −10$^{10}$ dynes/cm$^2$; low Si—H content of typically less than about 15 atomic %; and a low wet etch rate in HF solution (WER) of less than about 800 Å/min (normalized to thermal oxide at 1000 Å/min). However, a plasma produced at high concentrations of N$_2$ (where N$_2$:SiH$_4$ is greater than 2:1) in the precursor gas, produces a particularly non-uniform plasma over a large surface area, for example a substrate having dimensions larger than about 1000 mm×1000 mm (one square meter). This is believed to be due to the higher energy required to achieve dissociation of N$_2$ molecules. To overcome this problem with respect to the production of flat panel displays having large surface areas, the N$_2$ precursor gas was replaced by NH$_3$ precursor gas, which dissociates more easily.

More recently, there has been increased demand for even larger flat panel displays, for example those with substrates having dimensions larger than about 1500 mm×1800 mm. Initial efforts to produce flat panel displays of this size using a NH$_3$ precursor to supply nitrogen during formation of the a-SiN$_x$:H gate dielectric films resulted in the formation of a-SiN$_x$:H films exhibiting a higher hydrogen content in the film. As discussed above, this higher hydrogen content leads to a higher threshold voltage requirement for the TFT, which is harmful to performance of the TFT. There is presently a need for a process which permits formation of the a-SiN$_x$:H gate dielectric films over large surface area substrates.

SUMMARY OF THE INVENTION

We have discovered and further developed a method of PECVD depositing an a-SiN$_x$:H film useful as a TFT gate dielectric over surface areas larger than about 1000 mm×1000 mm, where the uniformity of the film thickness and uniformity of film properties including chemical composition is surprisingly consistent. In particular, the film deposition rate is more than 1000 Å/min and typically more than 1300 Å/min; the Si—H bonded content of the a-SiN$_x$:H film is less than about 15 atomic %; the film stress ranges from about 0 to about −10$^{10}$ dynes/cm$^2$; the film thickness across the substrate surface area varies by less than about 17%; the refractive index (RI) of the film ranged from about 1.85 to about 1.95, and, the wet etch rate in HF solution (which is an indication of film density) is less than 800 Å/min. The HF solution is one referred to in the industry as "Buffer Oxide Etchant 6:1", which contains 7% by weight hydrofluoric acid, 34% by weight ammonium fluoride, and 59% by weight water. The wet etching test is carried out at a substrate temperature of about 25° C. In addition, the chemical composition of the film, in terms of Si—H bonded content is consistently below the 15 atomic % maximum preferred.

An a-SiN$_x$:H gate dielectric film exhibiting the physical characteristics listed above provides excellent performance capabilities; and, the uniformity of the film across the substrate enables the production of flat panel displays having dimensions in the range of 1900 mm×2200 mm, and possibly even larger.

In a previous effort to obtain a uniform distribution across a substrate having the dimensions of 1200 mm×1300 mm, while providing an a-SiN$_x$:H gate dielectric film exhibiting a low threshold voltage (low hydrogen content), we used precursor source gas (precursor gas mixture) having a NH$_3$/SiH4 ratio ranging from 3.1 to 8.6, a N$_2$/SiH$_4$ ratio ranging from 10.0 to 35.8, and a N$_2$/NH$_3$ ratio ranging from 2.4 to 10.0. A nitrogen content at this level did not cause a problem with film uniformity in terms of thickness and properties, including chemical composition across the substrate. However, we discovered that when the substrate size was increased to dimensions of 1500 mm to 1800 mm, this precursor source gas produced a nonuniform film thickness which varied by as much as about 25%; produced film structures where the Si—H bonded content exceeded 23 atomic %; and, produced films where the wet etch rate in HF solution (normalized to thermal oxide 1000 Å/min) exceeded 2400 Å/min in some instances. Based on our earlier experience, the nitrogen content of the precursor source gas needed to be reduced to produce a more uniform film thickness across the substrate.

We were surprised to discover that by increasing the NH$_3$/SiH$_4$ ratio to range between 5.3 to 10.0, while decreasing the N$_2$/SiH$_4$ ratio to range between 5.5 and 18.7, and decreasing the spacing between electrodes by an amount between about 20% and 50% from the baseline 1000 mils, we were able to deposit a-SiN$_x$:H dielectric film with a film thickness which varied by less than about 16% over the substrate surface, while maintaining a Si—H bonded content in the film of less than 15 atomic %. The N$_2$/NH$_3$ ratio which provided excellent results ranged from about 0.6 to about 2.5, preferably 0.6 to about 2.3, which compared with the previous N$_2$/NH$_3$ ratio of 2.4 to 10. We also maintained a wet etch rate below about 800 Å/min over the a-SiN$_x$:H dielectric film surface using the new precursor source gas composition.

The critical requirement for deposition of an a-SiN$_x$:H dielectric film used as a passivation layer is that the substrate temperature during deposition of the passivation layer is less than about 300° C., to prevent damage to TFT channel ion migration characteristics and to reduce damage to the source/drain (S/D) metal as well. With this in mind, the passivation layer is deposited at a substrate temperature ranging between about 150° C. and about 300° C., and preferably between about 260° C. and 280° C. The general requirement in the industry for performance of the passivation layer is that the breakdown voltage not fall below about 5 MV/cm. The step coverage of the a-SiN$_x$:H dielectric film used as a passivation layer needs to be better than for the gate dielectric film, to provide conformality over the S/D channel regions of the TFT device. The mechanical properties of the passivation layer are also important. For example, film stress for the passivation layer should be lower than for a gate dielectric layer. The film stress for the passivation layer should range between about +3×10$^{10}$ to about −3×10$^{10}$. Due to the decrease in deposition temperature, the wet etch rate of the deposited film typically increase (the density of the film decreases). One skilled in the art will need to balance the change in breakdown voltage, step coverage, and mechanical properties against other changes in device structure and properties to determine the best substrate temperature for deposition, based on the device performance requirements.

The combination process parameters required to produce the a-SiN$_x$:H gate dielectric film having the properties and uniformity described above include the following:

A substrate temperature during film deposition which ranging from about 120° C. to about 340° C. in general, and from about 320° C. to about 340° C. when the substrate is glass;

a process pressure of less than about 2.0 Torr, and typically ranges from about 1.0 Torr to about 1.5 Torr;

a plasma density ranging between about 0.2 W/cm$^2$ and about 0.6 W/cm$^2$;

a plasma precursor gas mixture in which the precursors gases include N$_2$, NH$_3$, and SiH$_4$, and where the component ratios are NH$_3$/SiH$_4$ ranging from about 5.3 to about 10.0, N$_2$/SiH$_4$ ranging from about 5.5 to about 18.7, and N$_2$/NH$_3$ ranging from about 0.6 to about 2.3, and typically from about 0.6 to about 1.9;

an electrode spacing in the PECVD process chamber which is appropriate for the substrate size and to meet film property requirements; and a total precursor gas flow rate which is appropriate for the processing volume in the area of the substrate.

When the PECVD processing chamber is a parallel plate processing chamber, such as an AKT™ (Santa Clara, Calif.) PECVD 25KA System (of the kind used to carry out the experimentation presented in the Examples herein), the electrode spacing should be less than about 1000 mils (a mil≈0.001 inch), and typically ranges between about 800 and 400 mils. In addition, the total precursor gas flow rate should range from about 20,000 sccm to about 70,000 sccm.

One skilled in the art can calculate an equivalent electrode spacing and precursor gas flow rate when the plasma processing chamber is different from the processing chamber specified above (and described in more detail subsequently herein). For example, substrates having surface areas up to 9 m$^2$ are contemplated.

The combination process parameters required to produce an a-SiN$_x$:H passivation dielectric film are different from those required to produce a gate dielectric film. This is because the desired performance properties of the passivation dielectric layer are different, and because the device surface upon which the passivation dielectric layer is deposited is far more sensitive to substrate temperature at time of film deposition of the passivation dielectric layer. For example, the important performance characteristics of the passivation dielectric layer are not ion mobility and voltage threshold (as for the gate dielectric film), but are, instead, breakdown voltage, step coverage, and mechanical properties (such as residual film stress). An acceptable passivation layer may exhibit, for example, a WER of 5,000 or higher and a S—H bonded structure content of 20% or higher and still be acceptable. With respect to the ratios of precursor gases used for PECVD of a passivation layer of a-SiN$_x$:H, the ratio of NH$_3$/SiH$_4$ may easily range, for example and not by way of limitation, from about 5.6 to about 11.1, typically from about 5.6 to about 10.6. The ratio of N$_2$/SiH$_4$ may range, for example and not by way of limitation, from about 5.8 to about 20.8, and typically from about 5.8 to about 19.9. The ratio of N$_2$/NH$_3$ may range, for example and not by way of limitation, from about 0.4 to about 2.3, and typically from about 0.6 to about 1.9.

DETAILED DESCRIPTION OF EXEMPLARY EMBODIMENTS

Figure 1:
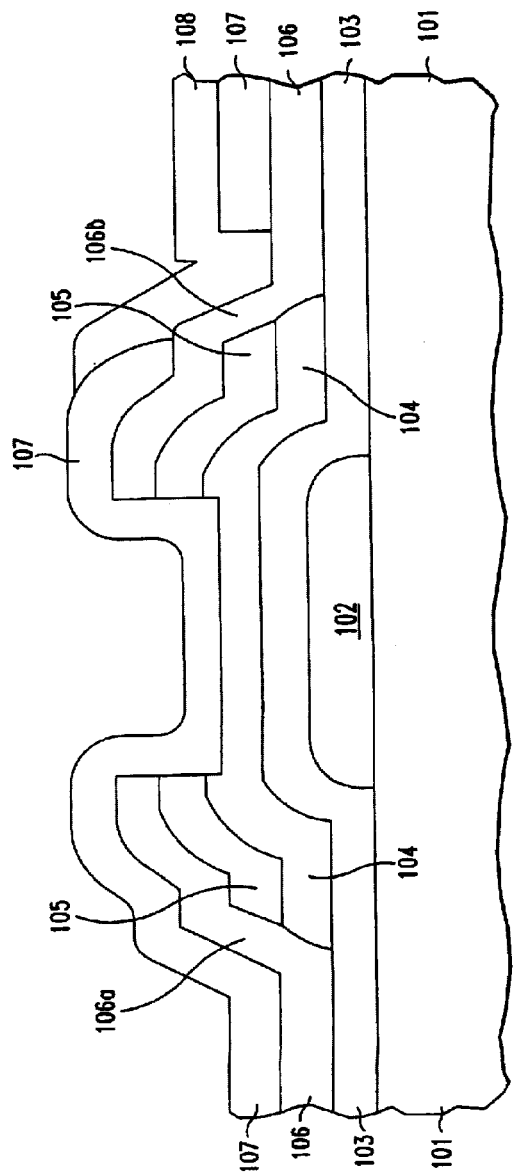
FIG. 1 shows a schematic cross-sectional view of one embodiment of a TFT device of the kind which employs the a-SiN$_x$:H gate and passivation dielectric films of the present invention.
Figure 2:
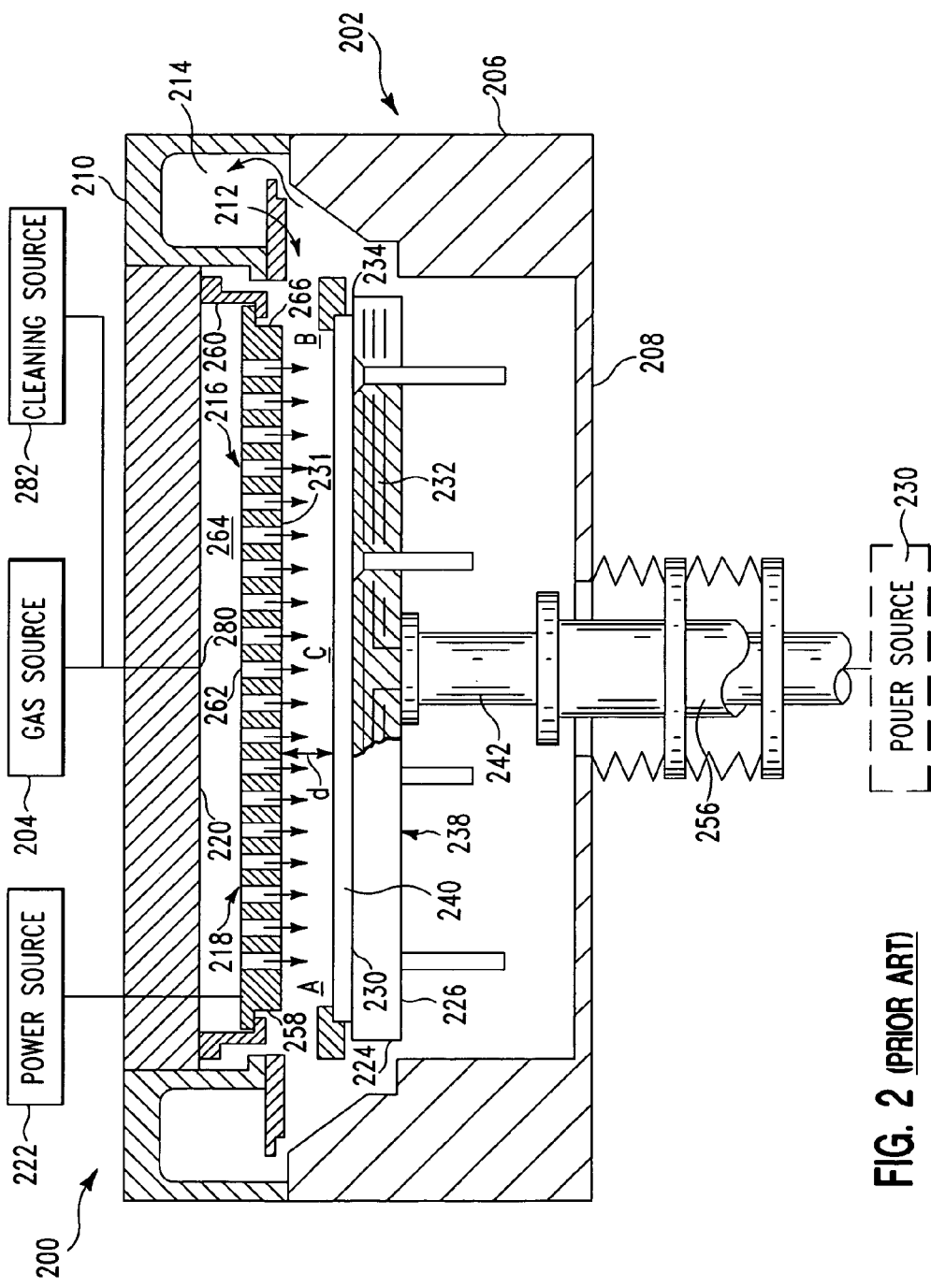
FIG. 2 shows a PECVD processing chamber of the kind which can be used to deposit the films of the present invention.

As a preface to the detailed description presented below, it should be noted that, as used in this specification and the appended claims, the singular forms "a", "an", and "the" include plural referents, unless the context clearly dictates otherwise.

We have developed a method of PECVD depositing a-SiN$_x$:H films which are useful in a TFT device as gate dielectric and passivation layers, when a series of TFT devices are arrayed over a substrate having a surface area larger than about 1000 mm×1000 mm, which may be as large as 1900 mm×2200 mm, and possibly even larger, up to a surface area of 9 m$^2$, for example. The a-SiN$_x$:H films provide a uniformity of film thickness and uniformity of film properties, including chemical composition, which are necessary independent of the substrate surface areas, but difficult to produce over large surface areas.

We were surprised to discover that by increasing the NH$_3$/SiH$_4$ ratio to range between 5.3 to 10.0, while decreasing the N$_2$/SiH$_4$ ratio to range between 5.5 and 18.7, and decreasing the spacing between electrodes by an amount between about 20% and 50% from the baseline 1000 mils, we were able to produce an a-SiN$_x$:H film which functioned well as a TFT gate dielectric. The film exhibited a thickness which varied by less than about 16% over the substrate surface, while maintaining a Si—H bonded content in the film of less than 15 atomic %. We also maintained a wet etch rate of the a-SiN$_x$:H deposited film below about 800 Å/min. The N$_2$/NH$_3$ ratio which provided excellent results ranged from about 0.6 to about 2.5, preferably 0.6 to 2.3, which compared with the previous N$_2$/NH$_3$ ratio of 2.4 to 10.

In addition to developing a method of producing an a-SiN$_x$:H dielectric film which functions well as a TFT gate dielectric, we developed an a-SiN$_x$:H dielectric film which functions well as a passivation layer overlying the upper conductive electrode of the TFT device. The critical requirement for deposition of an a-SiN$_x$:H passivation dielectric layer is that the substrate temperature during deposition is less than about 300° C. (on a glass substrate), to prevent damage to TFT channel ion migration characteristics, and to reduce damage to the source/drain (S/D) metal as well. With this in mind, the passivation layer is deposited at a substrate temperature ranging between about 150° C. and about 300° C., and preferably between about 260° C. and 280° C. The general requirement for performance of the passivation layer is that the breakdown voltage not fall below about 5 MV/cm. The step coverage of the a-SiN$_x$:H dielectric passivation layer needs to be better than for the gate dielectric film, to provide conformality over the S/D channel regions of the TFT device. The mechanical properties of the passivation layer are also important. For example, the film stress for the passivation layer should range between about +3×10$^{10}$ to about $-3\times10^{10}$. Due to the decrease in deposition temperature, the wet etch rate of the deposited film typically increase (the density of the film decreases). One skilled in the art will need to balance the change in breakdown voltage, step coverage, and mechanical properties against other changes in device structure and properties to determine the best substrate temperature for deposition, based on the device performance requirements.

I. AN APPARATUS FOR PRACTICING THE INVENTION

The embodiment example PECVD processes described herein were carried out in a parallel plate processing chamber, the AKT™ PECVD 25 KA System, available from AKT™, a division of Applied Materials, Inc., Santa Clara, Calif. The system 200 generally includes a processing chamber 202 coupled to a gas source 204. The processing chamber 202 has walls 206 and a bottom 208 that partially define a process volume 212. The process volume 212 is typically accessed through a port (not shown) in the walls 206 that facilitate movement of a substrate 240 into and out of processing chamber 202. The walls 206 support a lid assembly 210 that contains a pumping plenum 214 that couples the process volume 212 to an exhaust port (that includes various pumping components, not shown).

A temperature controlled substrate support assembly 238 is centrally disposed within the processing chamber 202. The support assembly 238 supports the glass (for example, but not by way of limitation) substrate 240 during processing. The substrate support assembly 238 typically encapsulates at least one embedded heater 232, such as a resistive element, which element is coupled to an optional power source 230 and controllably heats the support assembly 238 and the substrate 240 positioned thereon. Typically, in a CVD process, the heater maintains the substrate 240 at a uniform temperature between about 120° C. and 460° C., depending on the processing parameters of the substrate.

Generally, the support assembly 238 has a lower side 226 and an upper side 234. The upper side 234 supports the glass substrate 240. The lower side 226 has a stem 242 coupled thereto. The stem 242 couples the support assembly 238 to a lift system (not shown) that moves the support assembly 238 between an elevated processing position (as shown) and a lowered position that facilitates substrate transfer to and from the processing chamber 202. The stem 242 additionally provides a conduit for electrical and thermocouple leads between the support assembly 238 and other components of the system 200.

The support assembly 238 is generally grounded such that RF power supplied by a power source 222 to a gas distribution plate assembly 218 positioned between the lid assembly 210 and the substrate support assembly 238 (or other electrode positioned within or near the lid assembly of the chamber) may excite gases present in the process volume 212 between the support assembly 238 and the distribution plate assembly 218. The RF power from the power source 222 is generally selected commensurate with the size of the substrate, to drive the chemical vapor deposition process. The distance "d" illustrates the spacing between the upper surface 230 of substrate support assembly 238 and the lower surface 231 of distribution plate assembly 218. The spacing "d" in combination with the thickness of the substrate 240 substantially determines the processing volume 212. The spacing "d" can be adjusted as necessary to provide the desired processing conditions.

The lid assembly 210 typically includes an entry port 280 through which process gases provided by the gas source 204 are introduced into processing chamber 202. The entry port 280 is also coupled to a cleaning source 282. The cleaning source 282 typically provides a cleaning agent, such as disassociated fluorine, that is introduced into the processing chamber 202 to remove deposition by-products and films from processing chamber hardware.

The gas distribution plate assembly 218 is coupled to an interior side 220 of the lid assembly 210. The gas distribution plate assembly 218 is typically configured to substantially follow the profile of the substrate 230, for example, polygonal for large area substrates and circular for wafers. The gas distribution plate assembly 218 includes a perforated area 216 through which process and other gases supplied from the gas source 204 are delivered to the process volume 212. The perforated area 216 of the gas distribution plate assembly 218 is configured to provide uniform distribution of gases passing through the gas distribution plate assembly 218 into the processing chamber 202.

The gas distribution plate assembly 218 typically includes a diffuser plate 258 suspended from a hanger plate 260. The diffuser plate 258 and hanger plate 260 may alternatively comprise a single unitary member. A plurality of gas passages 262 are formed through the diffuser plate 258 to allow a predetermined distribution of a precursor source gas passing through the gas distribution plate assembly 218 and into the process volume 212. The hanger plate 260 maintains the diffuser plate 258 and the interior surface 220 of the lid assembly in a spaced-apart relation, thus defining a plenum 264 therebetween. The plenum 264 allows gases flowing through the lid assembly 210 to uniformly distribute across the width of the diffuser plate 258 so that gas is provided uniformly above the center perforated area 216 and flows with a uniform distribution through gas passages 262. passing

II. EXAMPLES

Example One

The Overall Process For Forming a TFT

To provide a general understanding of the relationship of the PECVD deposited a-SiN$_x$:H gate dielectric film and the a-SiN$_x$:H passivation dielectric film relative to the other components of the TFT, a brief description of the overall fabrication process of the TFT embodiment shown in FIG. 1 is presented below.

Figures 3A, 3B:
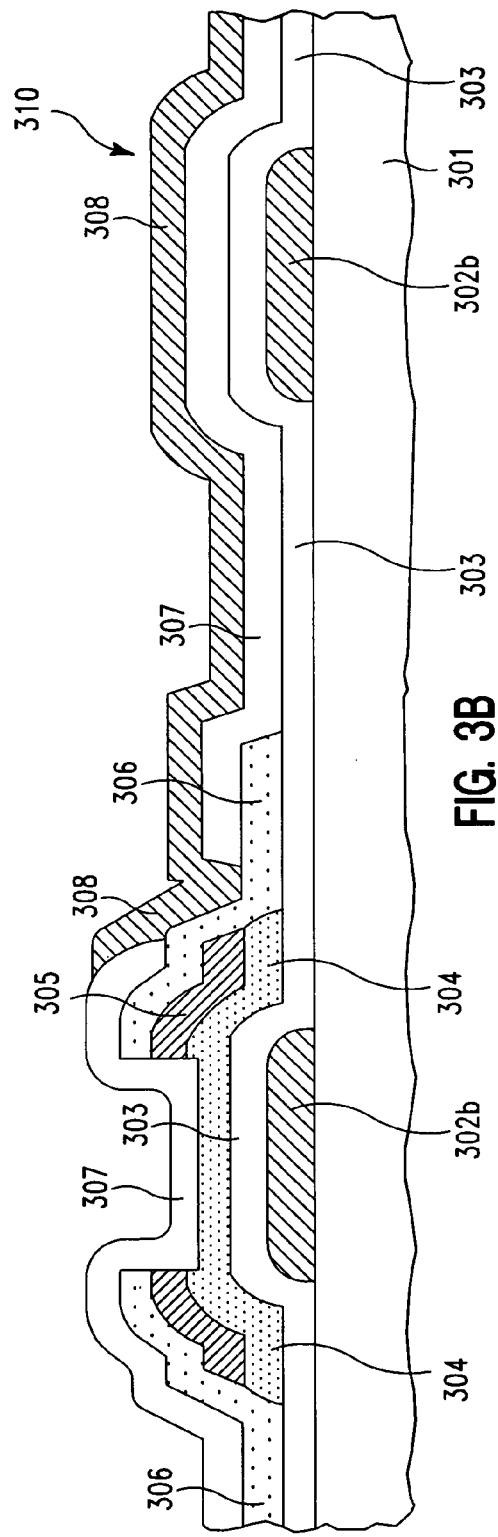
FIG. 3A shows a listing of all the steps which typically would be used to form a TFT structure of the kind shown in FIGS. 3B and 3C.
FIG. 3B shows a schematic side view of a substrate including a TFT structure.
Figure 3C:
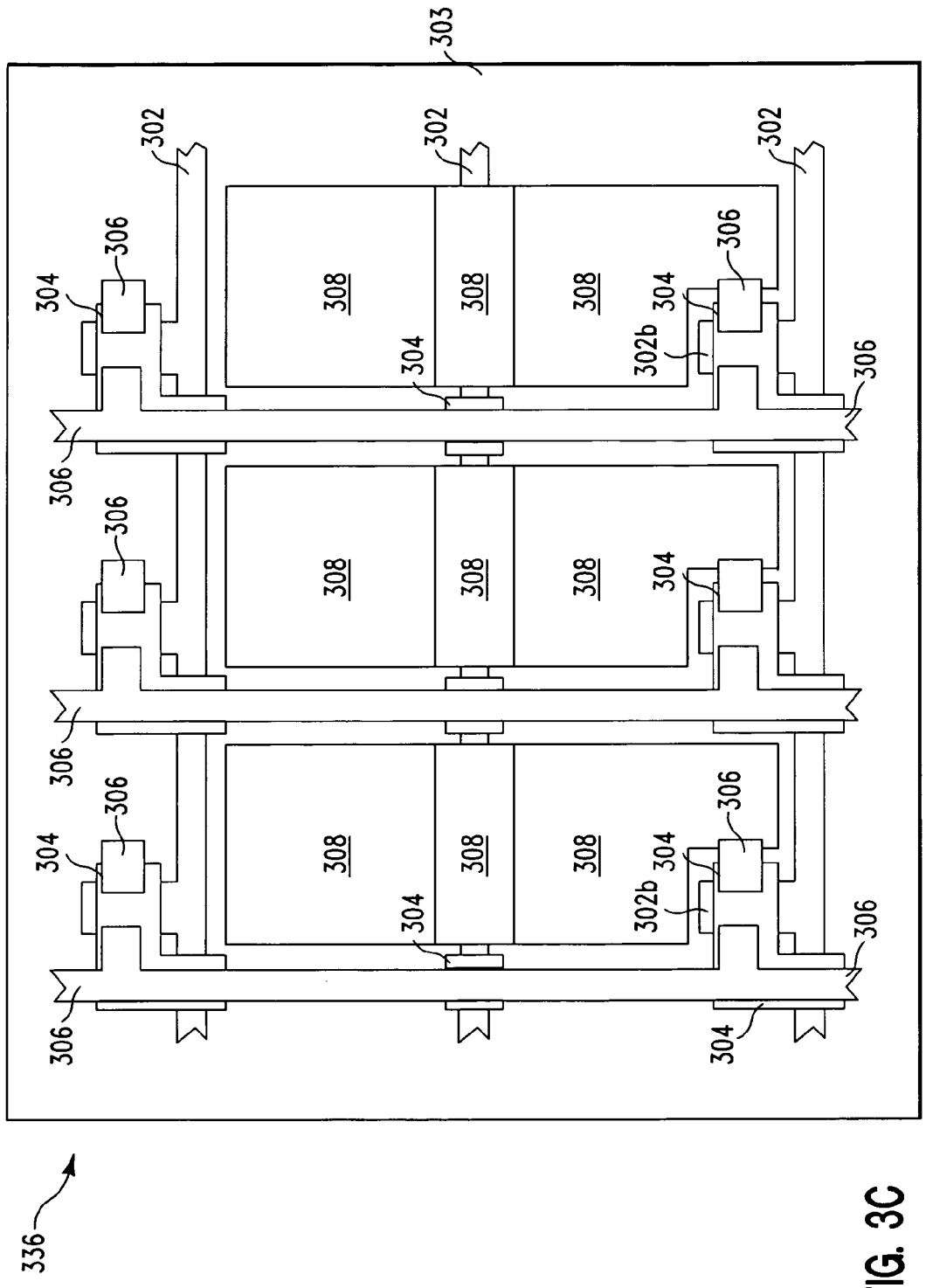
FIG. 3C shows a schematic top view of a substrate of the kind shown in FIG. 3B.

FIG. 3A show a series of process steps 300 which may be carried out to create the TFT device shown in FIG. 3B and 3C. FIG. 3B provides a schematic side view of a substrate including a TFT structure. FIG. 3C provides a schematic top-view 336 of a substrate including several TFT structures.

In the first step, "Gate Metal Sputtering", a conductive layer 302 is sputter deposited over a glass substrate 301 using techniques known in the art. In this particular instance the substrate 301 is a glass substrate having a thickness of 0.7 mm. The conductive layer 302 is actually a bilayer, where the bottom portion of the layer is a chrome layer, with an overlying layer of an aluminum neodymium alloy.

In the second step, "Gate Pattern (MASK 1)", the conductive layer 302 is pattern etched using a wet etch process known in the art to provide conductive electrodes 302b.

In the third step, "n$^+$ a-Si/a-Si/a-SiN$_x$:H PECVD", a layer 303 of a-SiN$_x$:H is blanket applied by the PECVD process of the present invention, which is described in detail subsequently herein. Following the deposition of layer 303, a layer 304 of a-Si is blanket deposited using a PECVD process which is known in the art. Finally, a layer 305 of n+ doped a-Si is blanket applied by processes known in the art, including a PECVD process, to provide a conductive layer which can later become the source and drain regions for the TFT device.

In the fourth step, "a-Si Pattern (MASK 2)", layers 304 of a-Si and 305 of n+ doped a-Si are pattern dry etched, using techniques known in the art.

In the fifth step in the process, "S/D Sputtering", a blanket sputtering deposition of a chrome layer 306 is carried out using techniques known in the art. A portion of the chrome layer 306 subsequently becomes part of the source and drain regions of the TFT device.

In the sixth step, "S/D Pattern (MASK 3)", chrome layer 306 is pattern dry etched, using techniques known in the art.

In the seventh step in the process, "n⁺ a-Si Etch-Back", the portion of the "n⁺ a-Si layer 305 which was exposed by the patterned dry etch in the sixth step is etched back using techniques known in the art. "n⁺ a-Si layer 305 is etched completely through, and is "overetched" into underlying layer 304 of a-Si.

In the eighth step in the process, "SiN$_x$:H PECVD", a passivation layer of a-SiN$_x$:H dielectric 307 is applied over the substrate surface using PECVD, by the method of the present invention.

In the ninth process step, "Passivation Etch (MASK 4)", the passivation layer of a-SiN$_x$:H dielectric 307 is pattern dry etched, using techniques known in the art.

In the tenth process step, "ITO Sputtering", a layer 308 of indium tin oxide is blanket sputter deposited over the substrate using techniques known in the art. The indium tin oxide layer 308 is a conductive optically clear layer when sputter deposited. This optically clear conductive layer enables the use of the TFT device for display applications.

In the eleventh process step, "ITO Pattern (MASK 5)"., the indium tin oxide layer 308 is pattern dry etched using techniques known in the art to produce a patterned conductive layer which permits addressing of individual TFT structures which are shown in a schematic top view 336.

Example Two

The Process For Depositing an a-SiN$_x$:H Gate Dielectric Layer

We have previously described all of the performance requirements for the a-SiN$_x$:H gate dielectric layer. We carried out extensive experimentation in an effort to produce a PECVD deposited a-SiN$_x$:H gate dielectric layer which met the performance requirements and which provided a uniformity in film thickness and uniformity in film properties, including structural and chemical composition, when PECVD deposited over a large surface area, larger than 1000 mm×1000 mm, for example. One basic requirement is that the a-SiN$_x$:H film deposition rate is more than 1000 Å/min and typically more than 1300 Å/min, so that the fabrication throughput for the TFT provides adequate productivity to be economically competitive. The basic requirements for the a-SiN$_x$:H film are that: the Si—H bonded content of the a-SiN$_x$:H film is less than about 15 atomic %; the film stress ranges from about 0 to about $-10^{10}$ dynes/cm$^2$; the refractive index (RI) of the film ranges from about 1.85 to about 1.95, and, the wet etch rate in HF solution (Buffer Oxide Etchant 6:1), which WER is an indication of film density, is less than 800 Å/min. In addition, the chemical composition of the film, in terms of Si—H bonded content is consistently below the 15 atomic % maximum preferred. In an alternative embodiment structure to that shown in FIG. 1, it is possible to deposit the a-SiN$_x$:H gate dielectric layer at a high deposition rate initially (higher than about 1300 Å/min), where the Si—H bonded content may be as high as about 20 atomic % and then to deposit the a-SiN$_x$:H gate dielectric layer at a low deposition rate (lower than about 1300 Å/min, and typically lower than 1,000 Å/min), where the Si—H bonded content is below the 15 atomic % preferred maximum. This provides a good interface between the between the a-Si layer which is subsequently deposited over the a-SiN$_x$:H gate dielectric layer. The film thickness uniformity across the substrate surface area should vary by less than about 17%. With respect to uniformity of chemical composition of the film across the substrate, it is preferred that the S—H bonded structure not vary by more than 4 atomic %. With respect to uniformity of other film properties across the wafer, it is preferred that the variation in stress be less than about $4 \times 10^9$ and that the wet etch rate (WER), which is also an indication of density, not vary more than 100 over the entire surface of the substrate.

Table 1 below presents data for experimental a-SiN$_x$:H gate dielectric layer PECVD trials. This data is relative to physical properties of the a-SiN$_x$:H gate dielectric layers produced. Table 2 below presents corresponding process parameter data for the experimental a-SiN$_x$:H gate dielectric layer films which are described in Table 1. The "Run" numbers correspond. This process development was carried out in an AKT™ 25 KA PECVD System of the kind previously described herein. Examples 1–6 are illustrative of deposited films which did not meet the target for the a-SiN$_x$:H gate dielectric layer which is to interface with an overlying a-Si layer. Examples 7–11 are illustrative of films which did meet the target.

TABLE 1

Properties of the a-SiN$_x$:H Gate Dielectric Film Deposited by PECVD

| Run No. | Chamber Near Window Side "A" | Chamber Near Center "C" | Chamber Near Slit Valve Side "D" | Maximum Difference | D/R Å/min | Variation in Film Thickness Uniformity, % (excluding 15 mm from edge of substrate) |
|---|---|---|---|---|---|---|
| 1 Thick-ness Å | 5991 | 5922 | 5895 | 96 | 2015 | 13.2 |

TABLE 1-continued

Properties of the a-SiN$_x$:H Gate Dielectric Film Deposited by PECVD

| | | | | |
|---|---|---|---|---|
| RI | 1.89 | 1.89 | 1.87 | 0.02 |
| Stress* × 10$^9$ dynes/cm$^2$ | +4.0 | +1.8 | +3.1 | 2.3 |
| N—H at % | 16.6 | 16.5 | 16.9 | 0.4 |
| S—H at % | 17.6 | 14.1 | 15.5 | 3.5 |
| WER Å/min | 1575 | 960 | 1822 | 862 |

| Run No. | Chamber Near Window Side "A" | Chamber Near Center "C" | Chamber Near Slit Valve Side "B" | Maximum Difference | D/R Å/min | Variation in Film Thickness Uniformity, % (excluding 15 mm from edge of substrate) |
|---|---|---|---|---|---|---|
| 2 | | | | | 2479 | 21.9 |
| Thick-ness Å | 6532 | 7970 | 6560 | 1438 | | |
| RI | 1.90 | 1.91 | 1.90 | 0.01 | | |
| Stress* × 10$^9$ dynes/cm$^2$ | +2.0 | −4.4 | −2.4 | 6.4 | | |
| N—H at % | 18.6 | 22.5 | 23.2 | 4.6 | | |
| S—H at % | 14.8 | 7.2 | 6.7 | 8.1 | | |
| WER Å/min | 826 | 395 | 468 | 431 | | |
| 3 | | | | | 2364 | 10.8 |
| Thick-ness Å | 6605 | 7119 | 6641 | 514 | | |
| RI | 1.88 | 1.89 | 1.87 | 0.02 | | |
| Stress* × 10$^9$ dynes/cm$^2$ | +3.0 | −2.5 | −2.0 | 5.5 | | |
| N—H at % | 21.6 | 26.1 | 27.5 | 5.9 | | |
| S—H at % | 16.2 | 9.2 | 7.2 | 9.0 | | |
| WER Å/min | 1137 | 554 | 882 | 583 | | |
| 4 | | | | | 2653 | 9.6 |
| Thick-ness Å | 7830 | 7775 | 7271 | 559 | | |
| RI | 1.91 | 1.93 | 1.92 | 0.02 | | |
| Stress* × 10$^9$ dynes/cm$^2$ | +2.1 | −2.9 | −0.5 | 5.0 | | |
| N—H at % | 20.1 | 24.3 | 29.6 | 9.5 | | |
| S—H at % | 23.0 | 19.6 | 26.9 | 7.3 | | |
| WER Å/min | 784 | 363 | 664 | 421 | | |
| 5 | | | | | 2492 | 10.3 |
| Thick-ness Å | 7320 | 7929 | 7430 | 609 | | |
| RI | 1.86 | 1.88 | 1.86 | 0.02 | | |
| Stress* × 10$^9$ dynes/cm$^2$ | +4.4 | −1.1 | +3.9 | 5.5 | | |
| N—H at % | 19.2 | 23.2 | 24.8 | 5.6 | | |
| S—H at % | 19.4 | 9.8 | 19.9 | 10.1 | | |
| WER Å/min | 2422 | 821 | 2023 | 1601 | | |
| 6 | | | | | 1374 | 15.7 |
| Thick-ness Å | 6165 | 7472 | 6086 | 1386 | | |
| RI | 1.91 | 1.90 | 1.92 | 0.02 | | |
| Stress* × 10$^9$ dynes/cm$^2$ | +2.5 | −1.6 | +1.0 | 4.1 | | |
| N—H at % | 17.5 | 21.1 | 18.0 | 3.6 | | |

TABLE 1-continued

Properties of the a-SiN$_x$:H Gate Dielectric Film Deposited by PECVD

|  |  |  |  |  |  |  |
|---|---|---|---|---|---|---|
| S—H at % | 18.4 | 7.6 | 13.3 | 10.9 |  |  |
| WER Å/min | 860 | 494 | 483 | 377 |  |  |
| 7 |  |  |  |  | 2286 | 16.2 |
| Thick-ness Å | 7013 | 8764 | 6999 | 1765 |  |  |
| RI | 1.91 | 1.90 | 1.91 | 0.01 |  |  |
| Stress* × 10$^9$ dynes/cm$^2$ | −2.2 | −3.9 | −1.6 | 2.3 |  |  |
| N—H at % | 20.5 | 20.7 | 20.7 | 0.2 |  |  |
| S—H at % | 11.1 | 7.7 | 11.0 | 3.4 |  |  |
| WER Å/min | 487 | 443 | 488 | 45 |  |  |
| 8 |  |  |  |  | 1711 | 12.4 |
| Thick-ness Å | 6230 | 7413 | 6576 | 1183 |  |  |
| RI | 1.91 | 1.90 | 1.90 | 0.01 |  |  |
| Stress* × 10$^9$ dynes/cm$^2$ | −1.0 | −3.7 | −2.0 | 2.7 |  |  |
| N—H at % | 22.5 | 24.5 | 22.9 | 2.0 |  |  |
| S—H at % | 11.1 | 7.6 | 10.3 | 3.5 |  |  |
| WER Å/min | 554 | 529 | 579 | 50 |  |  |
| 9 |  |  |  |  | 1563 | 15.4 |
| Thick-ness Å | 5421 | 6758 | 5871 | 1337 |  |  |
| RI | 1.92 | 1.91 | 1.91 | 0.01 |  |  |
| Stress* × 10$^9$ dynes/cm$^2$ | −5.3 | −8.1 | −5.3 | 2.8 |  |  |
| N—H at % | 22.0 | 24.8 | 22.5 | 2.8 |  |  |
| S—H at % | 7.8 | 4.8 | 7.9 | 3.1 |  |  |
| WER Å/min | 381 | 404 | 410 | 29 |  |  |
| 10 |  |  |  |  | 1622 | 13.3 |
| Thick-ness Å | 5555 | 6788 | 5857 | 1233 |  |  |
| RI | 1.93 | 1.92 | 1.92 | 0.01 |  |  |
| Stress* × 10$^9$ dynes/cm$^2$ | −4.6 | −7.5 | −5.4 | 2.9 |  |  |
| N—H at % | 22.6 | 25.3 | 23.8 | 2.7 |  |  |
| S—H at % | 8.5 | 5.1 | 7.8 | 3.3 |  |  |
| WER Å/min | 353 | 360 | 395 | 42 |  |  |
| 11 |  |  |  |  | 1327 | 8.3 |
| Thick-ness Å | 5888 | 6940 | 6131 | 1052 |  |  |
| RI | 1.88 | 1.88 | 1.88 | 0.00 |  |  |
| Stress* × 10$^9$ dynes/cm$^2$ | −2.3 | −4.2 | −2.1 | 2.1 |  |  |
| N—H at % | 28.4 | 28.3 | 27.6 | 0.8 |  |  |
| S—H at % | 4.7 | 2.9 | 4.7 | 1.8 |  |  |
| WER Å/min | 739 | 695 | 767 | 72 |  |  |

*+ denotes tensile stress and − denotes compressive stress.

TABLE 2

Process Conditions For Deposition of the a-SiN$_x$:H Gate Dielectric Film Deposited by PECVD

| Run No. | SiH$_4$ sccm | NH$_3$ sccm | N$_2$ sccm | RF[1] kW | Pr[2] Torr | Elect[3] Spcg Mil | DR[4] Å/min | NH$_3$/ SiH$_4$ | N$_2$/ SiH$_4$ | N$_2$/ NH$_3$ |
|---|---|---|---|---|---|---|---|---|---|---|
| 1 | 2760 | 12340 | 30820 | 11 | 1.5 | 1090 | 2015 | 4.5 | 11.2 | 2.5 |
| 2 | 2800 | 9600 | 28000 | 15 | 1.5 | 1050 | 2479 | 3.4 | 10.0 | 2.9 |
| 3 | 2800 | 9600 | 28000 | 15 | 1.8 | 1050 | 2364 | 3.4 | 10.0 | 2.9 |
| 4 | 3500 | 12000 | 35000 | 15 | 1.5 | 1050 | 2653 | 3.4 | 10.0 | 2.9 |
| 5 | 3300 | 15600 | 38200 | 14.4 | 1.8 | 1050 | 2492 | 4.7 | 11.6 | 2.4 |
| 6 | 2000 | 8800 | 32000 | 9 | 1.4 | 1000 | 1374 | 4.4 | 16.0 | 3.6 |
| 7 | 3500 | 29000 | 22000 | 15 | 1.5 | 800 | 2286 | 8.3 | 6.3 | 0.8 |
| 8 | 2500 | 20000 | 22000 | 11 | 1.7 | 600 | 1711 | 8.0 | 8.8 | 1.1 |
| 9 | 3300 | 36000 | 18000 | 11 | 1.3 | 600 | 1563 | 10.6 | 5.5 | 0.5 |
| 10 | 3300 | 28000 | 18000 | 11 | 1.3 | 600 | 1622 | 8.5 | 5.5 | 0.5 |
| 11 | 1500 | 15000 | 28000 | 8 | 1.5 | 600 | 1327 | 10.0 | 18.7 | 1.9 |

[1]RF power at 13.56 MHz.
[2]Process chamber pressure.
[3]Electrode spacing.
[4]Deposition Rate.

CONCLUSIONS BASED ON THE EXAMPLES

A review of all of the data presented herein indicates that it is possible to obtain an a-SiN$_x$:H gate dielectric film useful as a TFT gate dielectric, where large numbers of the TFTs are arrayed over surface areas larger than about 1000 mm×1000 mm. However, to obtain the uniformity of the film thickness and uniformity of film composition it is necessary to carefully control the process parameters used in production of the a-SiN$_x$:H gate dielectric film. With respect to uniformity of chemical composition of the film across the wafer, it is preferred that the S—H bonded structure not vary by more than 4 atomic %. With respect to uniformity of other film properties across the wafer, it is preferred that the variation in stress be less than about 4×10$^9$ and that the wet etch rate (WER), which is also an indication of density, not vary more than 100 over the entire surface of the substrate.

As previously discussed, to meet industry requirements, it is preferred that the film deposition rate is more than 1000 Å/min and typically more than 1300 Å/min. Further, with respect to film properties of the a-SiN$_x$:H gate dielectric film, the Si—H bonded content of the film should be less than about 15 atomic %; the film stress ranges from about 0 to about −10$^{10}$ dynes/cm$^2$; the film thickness across the substrate surface area varies by less than about 17%; the refractive index (RI) of the film ranged from about 1.85 to about 1.95, and, the wet etch rate in HF solution (which is an indication of film density) is less than 800 Å/min. In addition, the chemical composition of the film, in terms of Si—H bonded content should be consistently below the 15 atomic % maximum limit.

An a-SiN$_x$:H gate dielectric film exhibiting the physical characteristics listed above provides excellent performance capabilities; and, the uniformity of the film across the substrate enables the production of flat panel displays having dimensions in the range of 1870 mm×2200 mm (a surface area of 4.1 m$^2$), and even larger.

We were surprised to discover that by increasing the NH$_3$/SiH$_4$ ratio to range between 5.3 to 10.0, while decreasing the N$_2$/SiH$_4$ ratio to range between 5.5 and 18.7, we were able to deposit a-SiN$_x$:H dielectric film with a film thickness which varied by less than about 16% over the substrate surface, while maintaining a Si—H bonded content in the film of less than 15 atomic %. The resulting N$_2$/NH$_3$ ratio due to this change ranged from about 0.6 to 1.9, which compared with the previous N$_2$/NH$_3$ ratio of 2.4 to 10. We also maintained a wet etch rate below about 800 Å/min over the a-SiN$_x$:H dielectric film surface using the new precursor source gas composition.

The combination process parameters required to produce the a-SiN$_x$:H gate dielectric film having the properties and uniformity described above include the following: A substrate temperature during film deposition which ranges from about 320° C. to about 340° C.;

a process pressure of less than about 2.0 Torr, typically less than about 1.5 Torr;

a plasma density ranging between about 0.2 W/cm$^2$ and about 0.6 W/cm$^2$;

a plasma precursor gas mixture in which the precursors gases include N$_2$, NH$_3$, and SiH$_4$, and where the component ratios are NH$_3$/SiH$_4$ ranging from about 5.3 to about 10.0, N$_2$/SiH$_4$ ranging from about 5.5 to about 18.7, and N$_2$/NH$_3$ ranging from about 0.6 to about 2.3, typically from 0.6 to 1.9;

an electrode spacing in an AKT™ PECVD 25KA System, a parallel plate plasma processing chamber, which spacing is less than about 1000 mils (a mil–0.001 inch) and which typically ranges between about 800 mils and 400 mils;

and, a total precursor gas flow rate in the AKT™ PECVD 25KA System ranging from about 20,000 sccm to about 70,000 sccm.

One skilled in the art can calculate an equivalent electrode spacing and precursor gas flow rate when the plasma processing chamber is different from the processing chamber specified above (and described in more detail subsequently herein).

The combination process parameters required to produce an a-SiN$_x$:H passivation dielectric film are different from those required to produce a gate dielectric film, as previously described in the Summary Of Invention. For example, the important performance characteristics of the passivation dielectric layer are not ion mobility and voltage threshold (as for the gate dielectric film), but are, instead, breakdown voltage, step coverage, and mechanical properties (such as residual film stress). An acceptable passivation layer may exhibit, for example, a WER of 5,000 or higher and a S—H bonded structure content of 20% or higher and still be acceptable. With respect to the ratios of precursor gases used for PECVD of a passivation layer of a-SiN$_x$:H, the ratio of NH$_3$/SiH$_4$ may easily range, for example and not by way of limitation, from about 5.6 to about 11.1, typically from about 5.6 to about 10.6. The ratio of N$_2$/SiH$_4$ may range, for example and not by way of limitation, from about 5.8 to about 20.8, and typically from about 5.8 to about 19.9. The ratio of N$_2$/NH$_3$ may range, for example and not by way of limitation, from about 0.4 to about 2.3, and typically from about 0.6 to about 1.9.

Figure 4A:
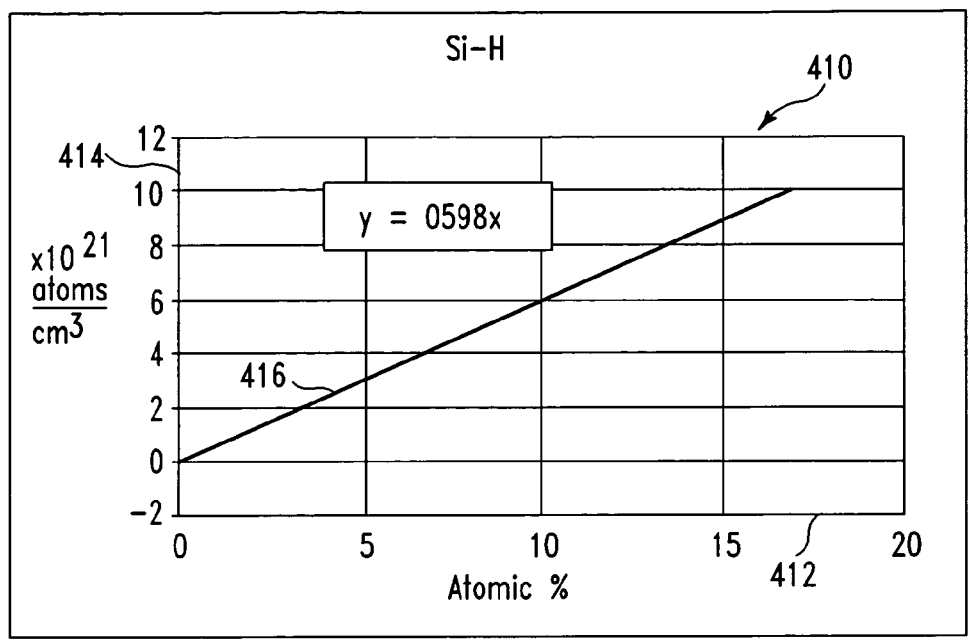
FIG. 4A shows a graph illustrating the relationship between the atomic % of Si—H bonded structure in the a-SiN$_x$:H dielectric film and the concentration of the Si—H bonded structure in terms of atoms which make up that structure/cm$^3$ of the a-SiN$_x$:H dielectric film.

FIG. 4A is a graph 410 which shows the relationship between the atomic weight % of Si—H bonded structure in the a-SiN$_x$:H gate dielectric film and the concentration of the Si—H bonded structure in terms of atoms which make up that structure/cm$^3$ of the a-SiN$_x$:H film. The atomic weight % of Si—H bonded structure is shown on the "x" axis which is labeled 412. The a-SiN$_x$:H film density in atoms/cm$^3$ is shown on the "y" axis which is labeled 414. The relationship represented by curve 416 is y=0.598x, which is the correlation. This graph is presented for reference purposes to aid in understanding of the description of the invention.

Figure 4B:
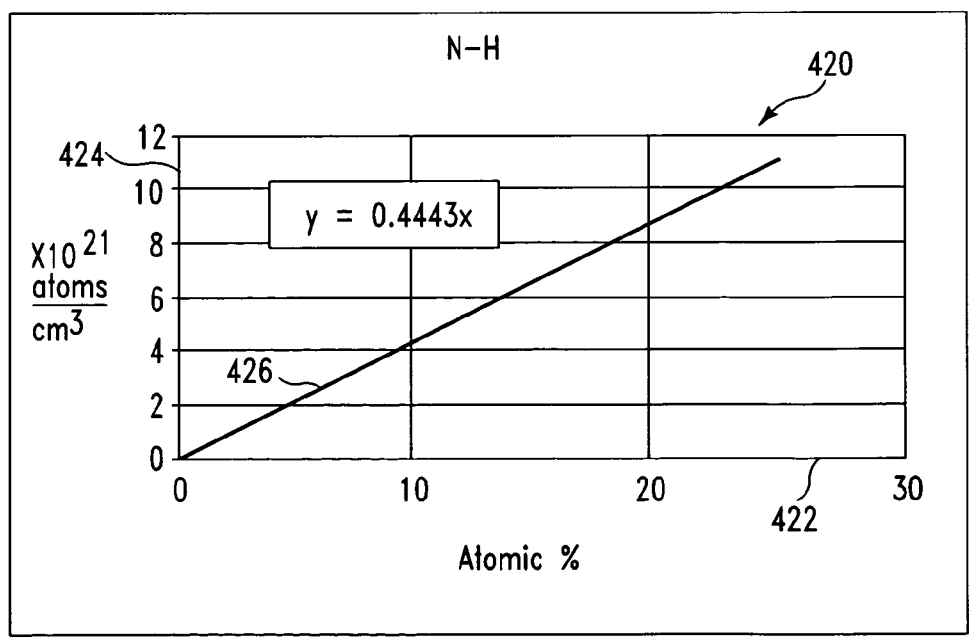
FIG. 4B shows a graph which illustrates the relationship between the atomic % of the N—H bonded structure in the a-SiN$_x$:H dielectric film and the concentration of the N—H bonded structure in terms of atoms which make up that structure/cm$^3$ of the a-SiN$_x$:H dielectric film.

FIG. 4B is a graph 420 which shows the relationship between the atomic weight % of N—H bonded structure in the a-SiN$_x$:H gate dielectric film and the concentration of the N—H bonded structure in terms of atoms which make up that structure/cm$^3$ of the a-SiN$_x$:H film. The atomic weight % of N—H bonded structure is shown on the "x" axis which is labeled 422. The a-SiN$_x$:H film density in atoms/cm$^3$ is shown on the "y" axis which is labeled 424. The relationship represented by curve 426 is y=0.4443x, which is the correlation. This graph is presented for reference purposes to aid in understanding of the description of the invention.

While the invention has been described in detail above with reference to several embodiments, various modifications within the scope and spirit of the invention will be apparent to those of working skill in this technological field. Accordingly, the scope of the invention should be measured by the appended claims.

We claim:

1. A method of PECVD depositing an a-SiN$_x$:H dielectric film useful in a TFT device as gate dielectric, when a series of TFT devices are arrayed over a substrate having a surface area larger than about 1 m$^2$, said method comprising:
   depositing said a-SiN$_x$:H dielectric film over a substrate which is at a temperature ranging from about 120° C. to about 340° C.;
   depositing said a-SiN$_x$:H dielectric film at a process pressure which ranges between about 1.0 Torr to about 2.0 Torr;
   depositing said a-SiN$_x$:H dielectric film from precursors including N$_2$, NH$_3$, and SiH 4, and wherein a component ratio of NH$_3$/SiH$_4$ ranges from about 5.3 to about 10.0, a component ratio of N$_2$/SiH$_4$ ranges from about 5.5 to about 18.7, and a component ratio of N$_2$/NH$_3$ ranges from about 0.6 to about 2.3; and
   applying a plasma to a mixture of said precursors, so that the plasma density in a process chamber in which said a-SiN$_x$:H dielectric film is deposited ranges between about 0.2 W/cm$^2$ and about 0.6 W/cm$^2$.

2. A method in accordance with claim 1, wherein an electrode spacing in said process chamber ranges from about 400 mils to about 1000 mils.

3. A method in accordance with claim 1 or claim 2, wherein said substrate temperature ranges from about 240° C. to about 320° C.

4. A method in accordance with claim 1 or claim 2, wherein said pressure in said process chamber ranges from about 1.0 Torr to about 1.5 Torr.

5. A method in accordance with claim 1, wherein said substrate surface area is larger than about 2.7m$^2$.

6. A method in accordance with claim 5, wherein said substrate surface area is larger than about 4.1 m$^2$.

7. A method in accordance with claim 6, wherein said substrate surface area is larger than about 9.0 m$^2$.

8. A method in accordance with claim 1, wherein said substrate surface area ranges between about 1.0 m$^2$ and about 4.1 m$^2$.

9. A method in accordance with claim 1, wherein a deposition rate of said a-SiN$_x$:H dielectric film is at least 1000 Å/min.

10. A method in accordance with claim 9, wherein said deposition rate is at least 1300 Å/min.

11. A method in accordance with claim 10, wherein said deposition rate is at least 1,600 Å/min.

12. A method in accordance with claim 11, wherein said deposition rate is at least 2300 Å/min.

13. A method in accordance with claim 12, wherein said deposition rate is at least 3000 Å/min.

14. A method in accordance with claim 1, wherein a deposition rate of said a-SiN$_x$:H dielectric film ranges between about 1000 Å/min and 2300 Å/min.

15. A method in accordance with claim 1, wherein the variation in said film thickness over said substrate is less than about 16%.

16. A method in accordance with claim 1, or claim 15, wherein the atomic % of Si-H bonded structure is less than about 20%.

17. A method in accordance with claim 16, wherein the atomic % of Si-H bonded structure is less than about 15%.

18. A method in accordance with claim 1, wherein a wet etch rate of said film in a solution of 7%. by weight hydrofluoric acid, 34% by weight aminonium fluoride, and 59% by weight water at a temperature of about 25° C. is less than 800 Å/min.

19. A method of PECVD depositing an a-SiN$_x$:H dielectric film useful in a TFT device as a passivation dielectric, when a series of TFT devices are arrayed over a substrate having a surface area larger than about 1 m$^2$, said method comprising:
   depositing said a-SiN$_x$:H dielectric film over a substrate which is at a temperature ranging from about 120° C. to about 340° C.;
   depositing said a-SiN$_x$:H dielectric film at a process pressure which ranges between about 1.0 Torr to about 2.0 Torr;
   depositing said a-SiN$_x$:H dielectric film from precursors including N$_2$, NH$_3$, and SiH4, and wherein a component ratio of NH$_3$/SiH$_4$ ranges from about 5.3to about 11.1, a component ratio of N$_2$/SiH$_4$ ranges from about 5.8 to about 20.8 and a component ratio of N$_2$/NH$_3$ ranges from about 0.5 to about 3.9; and
   applying a plasma to a mixture of said precursors, so that the plasma density in a process chamber in which said a-SiN$_x$:H dielectric film is deposited ranges between about 0.2W/cm$^2$ and about 0.6W/cm$^2$.

20. A method in accordance with claim 19, wherein an electrode spacing in said process chamber ranges from about 400 mils to about 1000 mils.

21. A method in accordance with claim 19 or claim 20, wherein said substrate temperature ranges from about 240 ° C. to about 320 ° C.

22. A method in accordance with claim 19 or claim 20, wherein said pressure in said process chamber ranges from about 1.0 Torr to about 1.5 Torr.

23. A method of PECVD depositing an a-SiN$_x$:H dielectric film useful in a TFT device as a passivation dielectric, when a series of TFT devices are arrayed over a substrate having a surface area larger than about 1 m$^2$, said method comprising:

depositing said a-SiN$_x$:H dielectric film over a substrate which is at a temperature ranging from about 120° C. to about 340° C.;

depositing said a-SiN$_x$:H dielectric film at a process pressure which ranges between about 1.0 Torr to about 2.0 Torr;

depositing said a-SiN$_x$:H dielectric film from precursors including N$_2$, NH$_3$, and SiH4, and wherein a component ratio of NH$_3$/SiH$_4$ ranges from about 5.0 to about 8.0, a component ratio of N$_2$/SiH$_4$ ranges from about 5.0 to about 6.0 and a component ratio of N$_2$/NlH$_3$ ranges from about 0.6 to about 1.2; and applying a plasma to a mixture of said precursors, so that the plasma density in a process chamber in which said a-SiN$_x$:H dielectric film is deposited ranges between about 0.2W/cm$^2$ and about 0.6W/cm$^2$.

* * * * *